United States Patent
Agrawal et al.

(10) Patent No.: US 8,832,626 B2
(45) Date of Patent: Sep. 9, 2014

(54) DISTRIBUTING SPARE LATCH CIRCUITS IN INTEGRATED CIRCUIT DESIGNS

(71) Applicant: International Business Machines Corporation, Armonk, NY (US)

(72) Inventors: Mitesh A. Agrawal, Jalgaon (IN); Santosh Balasubramanian, Bangalore (IN); Pradeep N. Chatnahalli, Shimoga (IN); Prasad Shivaram, Mysore (IN)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/796,259

(22) Filed: Mar. 12, 2013

(65) Prior Publication Data

US 2013/0191801 A1     Jul. 25, 2013

Related U.S. Application Data

(62) Division of application No. 13/315,914, filed on Dec. 9, 2011, now Pat. No. 8,490,039.

(51) Int. Cl.
   *G06F 17/50* (2006.01)
(52) U.S. Cl.
   CPC ................. *G06F 17/505* (2013.01)
   USPC .......... 716/114; 716/111; 716/112; 716/113; 716/119
(58) Field of Classification Search
   USPC .......................... 716/111–114, 119
   See application file for complete search history.

(56) References Cited

U.S. PATENT DOCUMENTS

| | | | |
|---|---|---|---|
| 5,623,420 A * | 4/1997 | Yee et al. ................ | 716/120 |
| 5,696,943 A | 12/1997 | Lee | |
| 6,513,149 B1 | 1/2003 | Donato | |
| 6,581,188 B1 | 6/2003 | Hosomi et al. | |
| 6,728,944 B2 | 4/2004 | Clabes et al. | |
| 6,763,505 B2 | 7/2004 | Baumgartner et al. | |
| 6,791,355 B2 * | 9/2004 | Vergnes ................ | 326/41 |
| 6,920,625 B2 | 7/2005 | Gass | |
| 6,993,738 B2 * | 1/2006 | Brazell et al. ............ | 716/119 |
| 7,127,647 B1 * | 10/2006 | Zorian et al. ............ | 714/711 |
| 7,149,924 B1 * | 12/2006 | Zorian et al. ............ | 714/30 |
| 7,191,380 B2 * | 3/2007 | Kuekes et al. ........... | 714/758 |
| 7,225,419 B2 | 5/2007 | Behnen et al. | |
| 7,257,745 B2 | 8/2007 | Huott et al. | |
| 7,350,132 B2 * | 3/2008 | Kuekes et al. ........... | 714/758 |
| 7,516,375 B2 * | 4/2009 | Fong et al. .............. | 714/724 |
| 7,546,567 B2 | 6/2009 | Cheon et al. | |
| 7,549,137 B2 | 6/2009 | Alpert et al. | |

(Continued)

OTHER PUBLICATIONS

Chang et al.; "Reap What You Sow: Spare Cells for Post-Silicon Metal Fix"; ISPD'08; Apr. 13-16, 2008; Portland, Oregon, USA; pp. 103-110.*

(Continued)

*Primary Examiner* — Naum Levin
(74) *Attorney, Agent, or Firm* — David Cain; Roberts Mlotkowski Safran & Cole, P.C.

(57) ABSTRACT

Methods for allocating spare latch circuits to logic blocks in an integrated circuit design are provided. A method includes determining logic blocks in the design and determining and determining an allocation of spare latch circuits among the logic blocks based on respective attributes of the logic blocks. The method further include placing the spare latch circuits in the design in accordance with the determined allocation based on local clock buffers corresponding with the logic blocks.

12 Claims, 5 Drawing Sheets

(56) References Cited

U.S. PATENT DOCUMENTS

| | | |
|---|---|---|
| 7,676,776 B2 | 3/2010 | Tsapepas et al. |
| 7,890,900 B2 * | 2/2011 | Aleksanyan et al. ......... 716/110 |
| 7,937,679 B2 | 5/2011 | Mariani |
| 7,971,162 B2 | 6/2011 | Wood |
| 8,015,522 B2 * | 9/2011 | Wang et al. .................. 716/107 |
| 8,276,018 B2 * | 9/2012 | Kursun et al. .................. 714/10 |
| 2007/0156379 A1 * | 7/2007 | Kulkarni et al. ............... 703/14 |
| 2007/0226556 A1 * | 9/2007 | Fong et al. .................... 714/724 |
| 2008/0036487 A1 | 2/2008 | Bradley et al. |
| 2008/0301614 A1 | 12/2008 | St. Juste et al. |
| 2009/0013206 A1 | 1/2009 | Curley et al. |
| 2009/0193376 A1 | 7/2009 | Alpert et al. |
| 2009/0193377 A1 | 7/2009 | Puri et al. |
| 2009/0210832 A1 | 8/2009 | Wood |
| 2011/0035712 A1 | 2/2011 | Gaugler et al. |
| 2011/0276935 A1 * | 11/2011 | Fouquet et al. ............... 716/112 |
| 2012/0124541 A1 | 5/2012 | Amundson et al. |

OTHER PUBLICATIONS

H. Lee and S. Paik, "Pulse Width Allocation and Clock Skew Scheduling: Optimizing Sequential Circuits Based on Pulsed Latches", IEEE Transactions on Computer-Aided Design of Integrated Circuits and Systems, Mar. 2010, pp. 355-366, vol. 29, No. 3.

IBM et al., "Method and Apparatus to Utilize Spare Latches as Measurement Latches in an Integrated Circuit", Ip.com, Jul. 12, 2006, IP.com No. IPCOM000138259D.

* cited by examiner

| INPUTS 205 | | | | | FACTORS 255 | | | | |
|---|---|---|---|---|---|---|---|---|---|
| | | | | | | WEIGHTS 290 | | | |
| | | | | | P0=0.25 | P1=0.25 | P2=0.25 | P3=0.25 | |
| Logic Block ID 210 | Age (months) 220 | Previous Usage (projects) 225 | Number of Bugs 230 | Percentage of Design Verified 235 | Design Age Factor (DAF) 260 | Design Bug Factor (DBF) 265 | Design Complexity Factor (DCF) 270 | Verification coverage Factor (VCF) 275 | Designer Input Factor (DIF) 280 |
| ABC_1 | 28 | 7 | 65 | 0.55 | 0.3 | 0.65 | 0.2 | 0.45 | 0.4 |
| ABC_2 | 20 | 5 | 25 | 0.75 | 0.5 | 0.25 | 0 | 0.25 | 0.25 |
| ABC_3 | 36 | 9 | 10 | 0.9 | 0.1 | 0.1 | 0.5 | 0.1 | 0.2 |
| ABC_4 | 36 | 9 | 0 | 0.8 | 0.1 | 0 | 0.1 | 0.2 | 0.1 |
| ABC_5 | 40 | 10 | 0 | 1 | 0 | 0 | 0.2 | 0 | 0.05 |

FIG. 2

DISTRIBUTING SPARE LATCH CIRCUITS IN INTEGRATED CIRCUIT DESIGNS

FIELD OF THE INVENTION

The invention relates to integrated circuits and, more particularly, to methods of designing and manufacturing integrated circuits having spare latch circuits.

BACKGROUND

Latch circuits serve as basic storage elements in integrated circuit (IC) designs. Thousands of latch circuits are used to accomplish a desired functionality of an IC. Design engineers typically add a percentage (e.g., 5-10%) of latch circuits to an IC design above the total number of latch circuits that are involved in the IC's function. These "spare latch circuits" are used to accommodate changes made to an IC design, after the physical layout of the circuit is finalized. For instance, the spare latch circuits may be used to correct bugs in the later stage of IC design discovered during verification and optimization steps.

Computer-Aided Design (CAD) tools that synthesize the IC circuit may base the physical layout on timing constraints (e.g., a time budget). However, because spare latch circuits have no timing limitations, at least when they are initially placed, the CAD tools position spare latch circuits at locations that are remote from logic elements within the design (e.g., clustered in corners of the IC). As such, when a design change is required, the spare latch circuits may be of little or no use in fulfilling the change.

Accordingly, there exists a need in the art to overcome the deficiencies and limitations described hereinabove.

SUMMARY

In an aspect of the invention, a computer-implemented method comprises determining logic blocks in an IC design. The method further comprises determining an allocation of spare latch circuits among the logic blocks based on respective attributes of the logic blocks. The method further comprises placing the spare latch circuits in the IC design in accordance with the determined allocation based on local clock buffers corresponding to the logic blocks in the IC design. The determining the allocation and the placing may be performed using a computing device.

In another aspect of the invention, a method comprises determining placements of logic blocks and local clock buffers in the IC design. The method further comprises determining an allocation of spare latch circuits to the logic blocks in the IC design based on corresponding design input factors. The method further comprises determining a correspondence between the local clock buffers and logic blocks in the IC design. The method further comprises, based on the determined correspondence, placing the a number of spare latch circuits in the IC design in accordance with the determined allocation of spare latch circuits, wherein the placing distributes the number of spare latch circuits among the local clock buffers.

In another aspect of the invention, a computer program product comprises a computer usable medium having a computer readable program stored in the medium, wherein the computer readable program, when executed on a computing device, is operable to cause the computing device to determine logic blocks in the IC design. Further, the computer readable program is operable to cause the computing device to determine, based on respective design input factors of the logic blocks, a relative probability of design change for each of the logic blocks. Further, the computer readable program is operable to determine, based on the relative probability of design change for each of the logic blocks, a number of spare latch circuits to allocate among the logic blocks, wherein a logic block having a greater probability of design change is allocated a greater proportion of a total number of available spare latch circuits relative to a logic block having a lower probability of design change.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

FIG. 2 shows a table of illustrative information usable to determine an allocation of spare latch circuits used in implementing designs and steps in accordance with aspects of the invention;

DETAILED DESCRIPTION

Figure 1:
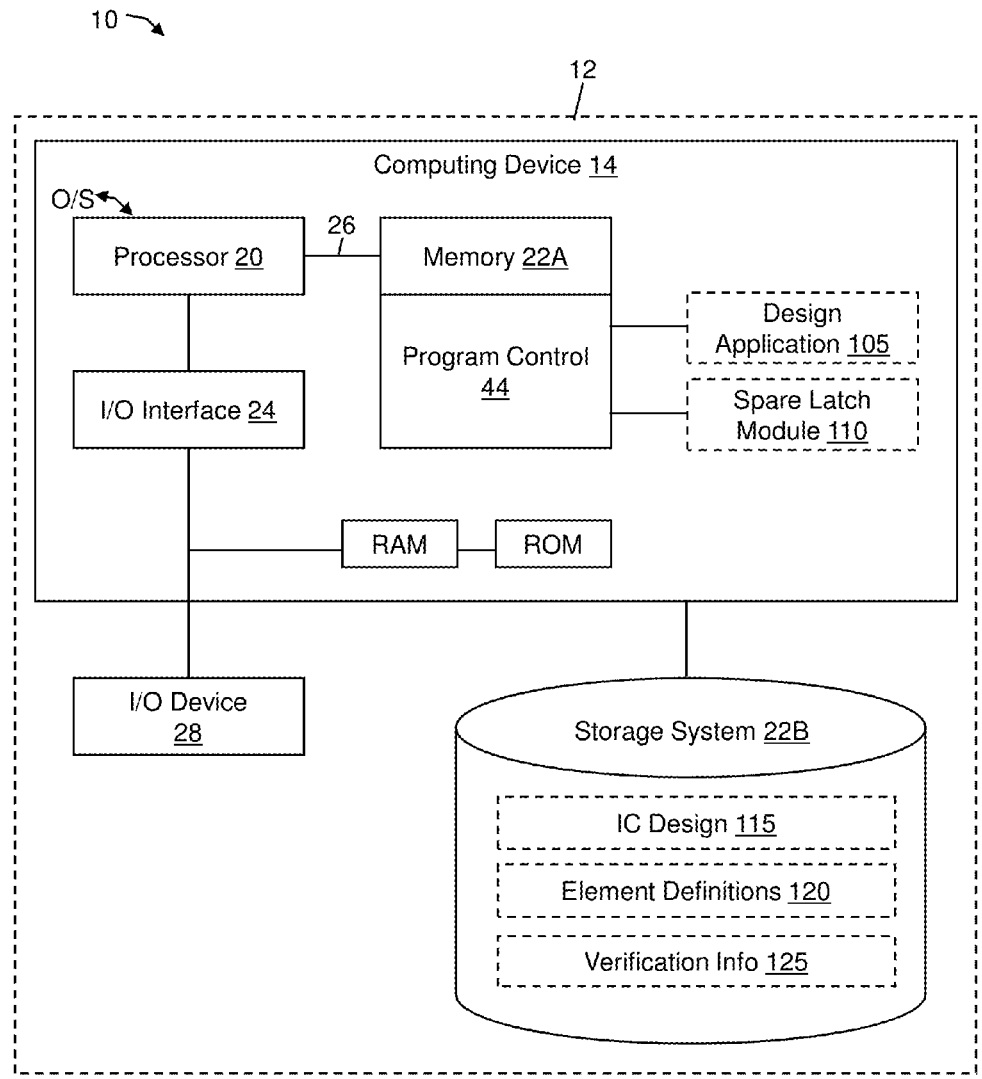
FIG. 1 shows an illustrative environment for implementing designs and steps in accordance with aspects of the invention.

The invention relates to integrated circuits and, more particularly, to methods of designing and manufacturing integrated circuits in which spare latch circuits are allocated to logic blocks. In embodiments of the present invention, the spare latch circuits are allocated to logic blocks based on a determination of the likelihood that a design change will be made to the logic blocks. The determination of the likelihood of a design change may be based on respective attributes of the logic blocks, including, but not limited to, the age of a logic block design, the number of times a logic block design has already been used in other designs, the number of bugs that have been found in a logic block design, the complexity of a logic block design, and percentage of a logic block design that has been verified. The determination of the likelihood of a design change to a logic block may further be based on weighted average values of the attributes, such that the most efficacious attributes have the greatest impact on the determination. In this manner, implementations of the invention advantageously allocate spare latch circuits to locations in IC designs where they are most likely to be used. By doing so, IC designers have more flexibility to address bugs, design changes and other issues encountered after the IC design is finalized.

According to aspects of the invention, logic blocks are instances of designs that may be linked together in stages to perform complex functions or operations in an IC design. Combinational logic within the logic blocks perform the functions upon information received from a previous stage. Latches (i.e., registers) positioned between the logic blocks store intermediate information that is passed between logic blocks. In the disclosed embodiments, latch circuits include at least a latch, buffer and clocking structure such that the latch circuits are responsive to one or more clock signals that control the movement of information through the IC. The clock signals are provided to the logic blocks by one or more corresponding local clock buffers (LCBs) that generate local clock signals based on one or more global clock signals for the IC. As used herein, the term "latch" includes any type of information storage unit, including registers, latches or flip-flops.

System Environment

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable mediums having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

FIG. 1 is an exemplary environment 10 for implementing the steps in accordance with aspects of the invention. To this extent, the environment 10 includes a server or other computing infrastructure 12 that can perform the processes described herein. In particular, the computer infrastructure 12 includes a computing device 14. The computing device 14 can be resident on a network infrastructure or computing device of a third party service provider (any of which is generally represented in FIG. 1).

The computing device 14 also includes a processor 20, memory 22A, an I/O interface 24, and a bus 26. The memory 22A can include local memory employed during actual execution of program code, bulk storage, and cache memories which provide temporary storage of at least some program code in order to reduce the number of times code must be retrieved from bulk storage during execution. In addition, the computing device includes random access memory (RAM), a read-only memory (ROM), and an operating system (O/S).

The computing device 14 is in communication with the external I/O device 28 and a storage system 22B. For example, the I/O device 28 can comprise any device that enables an individual to interact with the computing device 14 (e.g., user interface) or any device that enables the computing device 14 to communicate with one or more other computing devices using any type of communications link. The external I/O device/resource 28 may be for example, a handheld device, PDA, handset, keyboard etc.

In general, the processor 20 executes computer program code (e.g., program control 44), which can be stored in the memory 22A and/or storage system 22B. Moreover, in accordance with aspects of the invention, the program control 44 controls a design application 105 and a spare latch module 110 that perform one or more of the processes described herein. The design application 105 and the spare latch module 110 can be implemented as one or more sets of program code in the program control 44 stored in memory 22A as separate or combined modules. Additionally, the design application 105 and the spare latch module 110 may be implemented as separate dedicated processors or a single or several processors to provide the function of these tools.

While executing the computer program code, the processor 20 can read and/or write data to/from the memory 22A, the storage system 22B, and/or the I/O interface 24. The program code executes the processes of the invention, for example, the design application 105 and the spare latch module 110. Further, data read and/or write data to/from the memory 22A, the storage system 22B and/or the I/O interface 24 may include an IC design 115, element definition 120 and verification information 125. The bus 26 provides a communication link between each of the components in the device 14.

In accordance with aspects of the invention, the design application 105 is computer program code stored in, for example, memory 22A and/or storage system 22B that, when executed by the processor 20, causes the computing device 14 to determine the IC design 115. The design application 105 may include one or more software or hardware modules for designing, modeling and verifying IC designs using a hardware description language, such as VERILOG or VHDL. For instance, the design application 105 may be a synthesis/placement CAD tool that reads in design definitions (e.g., VHDL), physical area constraints, timing constraints, power constraints, design library information, synthesis rules, and operating conditions. Using these various parameters, the design application 105 may iteratively determine a layout for elements in an IC design. The determined layout and associated information may be stored by the computing device 14 in storage system 22B as the IC design 115. Information in the layout may be referenced by the design application 105 and the spare latch module 110 to find (i.e., identify) logic blocks and corresponding local clock buffers in the design in order to place spare latch circuits at the logic blocks and or local clock buffers.

The design application 105 may determine the IC design 115 based on element definitions 120 stored in storage system 22B (and/or memory 22A). The element definitions 120 include descriptive information (e.g., design comments, version information, debugging histories and verification data) and requirement information (e.g., physical information, timing requirements, and netlists). For instance, the logic blocks of the IC design 115 may be defined by a user (e.g., design engineer) using a hardware design language (HDL) files (e.g., Very-Large scale Integrated Circuit Hardware Description Language (VHDL)). Also, the element definitions 120 may define the physical area available for element placement in the IC design 115 in data files (e.g., assertion files) containing physical cell placement information and timing constraints.

As described in greater detail below, the design application 105 may determine the placement of spare latch circuits in the IC design 115 based on information determined by the spare latch module 110. The spare latch module 110 is program code or a hardware component that, when executed by the processor 20, controls the computing device 14 to perform steps for determining a Design Input Factor (DIF) for each logic block included in the IC design 115 based on, for example, the element definitions 120 and the verification information 125. The DIF value represents a probability of a design change to a logic block relative to other logic blocks in the IC design 115. In embodiments, the design application 105 places spare latch circuits among the logic blocks in the IC design 115 in proportion to the DIF values.

In embodiments, the spare latch module 110 determines the DIF values based on information provided by a user of the computing device 14 via the I/O device 28. In some instances, the user may provide some or all of the attributes used to determine the DIF values (e.g., design age information, design bug information, design complexity information, verification coverage information, and/or weighting factors) within the element definitions 120. Alternatively or additionally, the computing device 14 may execute an interactive computer-user interface via the I/O device 28 that prompts the user to provide some or all of this information.

The attribute information may be identified with a particular logic block in the design and stored in association with the corresponding element definitions 120. For example, the DIF value for each of hierarchical sub block in a VHDL design may be stored in the element definitions 120 as an attribute which is later used by design application 105 to determine the number of spare latch circuits to allocate across various logic blocks of the IC design 115.

According to aspects of the invention, once the spare latch module 110 calculates DIF values for each logic block, the values are provided to the design 105 application as inputs to the IC design 115. For instance the DIF values may be stored in the corresponding element definitions 120 as VHDL attributes. After the determining of locations of elements in the IC design 115, including logic blocks, latch circuits and LCBs, the design application 105 determines a number of spare latch circuits allocated to each logic block based on DIF value and determines a placement of the spare latch circuits in regions of LCBs associated, respectively, with the logic blocks. Subsequently, the design application 105 may continue with further placement, optimization and verification steps in the IC design process.

The computing device 14 can comprise any general purpose computing article of manufacture capable of executing computer program code installed thereon (e.g., a personal computer, server, etc.). However, it is understood that the computing device 14 is only representative of various possible equivalent-computing devices that may perform the processes described herein. To this extent, in embodiments, the functionality provided by the computing device 14 can be implemented by a computing article of manufacture that includes any combination of general and/or specific purpose hardware and/or computer program code. In each embodiment, the program code and hardware can be created using standard programming and engineering techniques, respectively.

Similarly, the computing infrastructure 12 is only illustrative of various types of computer infrastructures for implementing the invention. For example, in embodiments, the server 12 comprises two or more computing devices (e.g., a server cluster) that communicate over any type of communications link, such as a network, a shared memory, or the like, to perform the process described herein. Further, while performing the processes described herein, one or more computing devices on the server 12 can communicate with one or more other computing devices external to the server 12 using any type of communications link. The communications link can comprise any combination of wired and/or wireless links;

any combination of one or more types of networks (e.g., the Internet, a wide area network, a local area network, a virtual private network, etc.); and/or utilize any combination of transmission techniques and protocols.

FIG. 2 shows a table 200 illustrating exemplary information the spare latch module 110 may use in determining a proportional allocation of spare latch circuits. In embodiments, the spare latch module 110 uses one or more types of information listed in the table 200 to determine DIF values for the logic blocks included in the IC design 115. Further, using the determined DIF values, the design application 105 determines a number of spare latches to allocate to each of the logic blocks, and places the allocated number of spare latches in the IC design 115.

In embodiments, the table 200 includes two sections: inputs 205 and factors 255. The inputs 205 represent information that may be used by spare latch module 110 to determine the factors 255. For each logic block, the inputs 205 include a logic block identifier 210, logic block age 220, previous usage 225, number of logical bugs 230 and percentage of design verified 235. It should be noted that the information shown in FIG. 2 is arranged in the table 200 for the sake of example. The invention is not limited to storing data in tabular form, and other data structures may be used. Further, the invention is not limited to the exemplary inputs 205 and factors 255, and other numbers and/or types of inputs and factors may be used within the scope of the invention.

The logic block identifier 210 is a unique name given to each logic block in the design. For instance, the table 200 includes five exemplary logic blocks: ABC_1, ABD_2, ABC_3, ABC_4 and ABC_5 (collectively, "logic blocks ABC"). The logic block identifiers 210 may be commonly used across the design application 105, the spare latch module 110, the IC design 115, the element definitions 120 and the verification information 125. In some embodiments, identifiers 210 are hierarchical identifiers in VHDL, and the logic blocks are instantiated in the IC design 115 according to the VHDL identifiers. For the sake of example, only five logic blocks shown in FIG. 2. Of course, an actual design may include a far greater number of logic blocks.

The age 220 is a value associated with each of the logic blocks ABC that indicates the total age of each logic block since it was first designed and/or implemented in a design. In embodiments, the values of the logic blocks ages 220 may correspond to the maturity of each logic block's design. As such, a more mature logic block may be expected to involve fewer changes. Thus, exemplary logic block ABC_2 would have an age of twenty (20) months from the time it was first used in a design, whereas logic block ABC_5 has an age of forty (40) months. Due to the age of ABC_5 being greater than that of ABC_2, logic block ABC_5 may be expected to involve fewer changes when the design is verified and, accordingly, fewer spare latch circuits may be allocated to logic block ABC_5 by spare latch module. Notably, for the sake of example, the values of the logic block ages 220 in the table 200 represent months but, of course, other time units may be used in the invention.

The previous usage 225 is a value associated with each of the logic blocks ABC that indicates a number of times each logic block has been used in a design over a period of time. Values of the previous usage 225 correspond to the maturity of the logic blocks' designs. Thus, a particular logic block that has been reused more often may have been repeatedly optimized and, as such, be expected to involve fewer changes. In embodiments, the period of time may be the time since the logic block was first created and/or implemented in a project. In other embodiments, the period of time includes a moving window, such as the most recent twelve months. In the table 200, the values of the previous usage 225 represent a number of projects. Hence, logic block ABC_1 may have been used in seven (7) projects, whereas logic block ABC_2 may have been used in five (5) projects. Due to ABC_1 having been used in more projects than ABC_2, logic block ABC_1 may be expected to involve fewer changes than logic block ABC_2 when the design is verified. Accordingly, based on the differences in their respective values of previous usage 225, the number of spare latches allocated to logic block ABC_1 may be reduced in proportion to logic block ABC_2.

The number of bugs 230 is a value associated with each of the logic blocks ABC that indicates the total number of logical bugs that have been found in relation to the logic block's design over a period of time. A value of the number of bugs 230 corresponds to the reliability and/or robustness of the logic block's design. As such, a logic block having a higher value for the number of bugs 230 may be expected to involve a greater number of changes. In embodiments, the period of time may be the time since the logic block was first created and/or implemented in a project. In other embodiments, the period of time includes a moving window, such as the most recent twelve months. In the table 200, the values of the number of bugs 230 represent a count of the total number of logic bugs that have been found in a corresponding one of logic blocks ABC over a period of time (e.g., since the blocks inception date, within the most recent twelve months, etc.). Thus, for example, logic block ABC_1 may have sixty-five (65) total bugs since it was first used, whereas logic block ABC_4 may have zero (0) bugs. Due to the difference in the number of bugs, logic block ABC_1 may be expected to involve more changes than logic block ABC_4 when the design is verified. Accordingly, based on the differences in their respective values of number of bugs 230, the number of spare latches allocated to logic block ABC_1 may be increased in proportion to logic block ABC_4.

The percentage of design verified 235 is a value associated with each of the logic blocks ABC that indicates the extent to which design of each logic block has been verified by testing. Practical considerations, such as time and cost, limit the amount of testing that may be used to verify the operation of logic blocks ABC. Accordingly, only a percentage of the total functional and/or operational envelope of a particular logic block may be verified. In embodiments, a value of the percentage of design verified 235 corresponds to the reliability and/or robustness of the logic block's design. As such, a logic block having a low value for the percentages of design verified 235 may be expected to involve a greater number of changes. For example, if one hundred tests would be required to verify the entire functional and operational envelope of logic block ABC_1, but only fifty-five (55) tests were performed, the value of percentage design verified 235 for logic block ABC_1 would be fifty-five percent (0.55). In comparison, if one hundred tests would be required to verify the entire functional and operational envelope of logic block ABC_2, and ninety-nine (99) tests were performed, the value of percentage design verified 235 for logic block ABC_2 would be ninety-nine percent (0.99). Accordingly, based on the differences in their respective values of design verified 235, the number of spare latches allocated to logic block ABC_1 may be increased in proportion to logic block ABC_2.

The above-described inputs 205, including block age 220, previous usage 225, number of bugs 230, percentage of design verified 235, may be defined by user input and/or may be automatically determined by the design application 105. For example, a user may manually enter data defining one or more of the inputs 205 using the I/O device 28. Additionally or alternatively, the computing device 14 may automatically calculate the value of one or more of the inputs based on attributes within the element definitions 120.

The inputs 205 may be stored by the computing device 14 in association with the corresponding logic block identifiers 210. For instance, the inputs 205 may be stored in data files (e.g., VHDL files) associated with the element definitions 120 in storage system 22B. In addition, the inputs 205 may be stored as attributes of logic blocks within their corresponding element definitions 120 (e.g., VHDL files). Furthermore, the inputs 205 may be stored and/or retrieved from a database of verification information containing, for example, results (e.g., bug tracking tools/sheets) of verification tests that have been performed on logic blocks ABC.

Still referring to FIG. 2, the table 200 includes factors 255 used to calculate the allocation of spare latch circuits to logic blocks in the IC design 115. In embodiments, the spare latch module 110 determines the factors 255 based on the inputs 205. Additionally, or alternatively, the spare latch module 110 may execute program code that provides an interactive user interface via the I/O device 28 prompting a user (e.g., a design engineer) to provide values for the factors 255.

In embodiments, the factors 255 include design age factors (DAF) 260, design bug factors (DBF) 265, design complexity factor (DCF) 270 and verification coverage factors (VCF) 275. The factors 260, 265, 270 and 275 are illustrative and are not intended to limit the invention. Other numbers and types of factors 255 may be used within embodiments of the invention.

In embodiments, the DAF 260 is a value associated with each of the logic blocks ABC that indicates a logic block's stability. Designs which are stable over time and across several previous projects are less prone for design changes later in design cycle and less likely to be changed. For instance, logic block ABC_1 may have a DAF value of 0.3, whereas logic block ABC_2 may have a DAF of 0.5. Due to logic block ABC_1 having a greater DAF value than ABC_2, logic block ABC_1 may be expected to involve fewer changes than logic block ABC_2 when the design is verified and, accordingly, fewer spare latch circuits may be allocated to logic block ABC_1 by spare latch module.

For example, the DAF 260 may be determined according to Equation (1) below:

$$DAF = 1 - ((\text{normalized block age}) + (\text{normalized block usage}))/2 \quad (1)$$

The normalized block age for each block may be determined using the age 220 of the corresponding one of blocks ABC, normalized based on the ages 220 of all the blocks ABC_1 to ABC_5. Likewise, the normalized block usage for each block may be determined using the previous usage 225 of the corresponding one of blocks ABC, normalized based on the previous usages 225 of all the blocks ABC_1 to ABC_5. It should be recognized that DAF 260 may be determined using greater or fewer attributes of a block's design age. For example, the DAF 260 may be based solely on either age 220 or previous usage 225. On the other hand, the DAF 260 may be based on age 220 and previous usage 225, along with another input associated with age, such as the time (e.g., months) since the block was used in any design (not shown).

In embodiments, the DBF 265 is a value associated with each of the logic blocks ABC that indicates how many bugs were found in relation to the logic block's design during, for example, verification of the block's design. Logic blocks having previous bugs are more likely to involve design changes later in design cycle. The DBF 265 may be determined according to Equation (2) below:

$$DBF = (\text{normalized total number of bugs})/(\text{period of specified time}) \quad (2)$$

The normalized total number of bugs for each logic block may be determined using number of bugs 230 of the corresponding one of blocks ABC, normalized based on the number of bugs 230 for all the blocks ABC_1 to ABC_5. The period of specified time may be any time period, such as days, months, years, or parts thereof.

In embodiments, the design complexity factor (DCF) 270 is a value associated with each of the logic blocks ABC that indicates a relative complexity of each logic block. More complex blocks are more likely to have design changes later in design cycle. The DCF 270 may be determined according to Equation (3) below:

$$DCF = (\text{Normalized complexity}) \quad (3)$$

The normalized complexity is a relative merit value between zero and one determined based on the complexity value of each logic block. The complexity value for a logic block may be determined by user input and/or may be automatically determined by the design program 105. For example, a user may manually enter data defining a logic block's complexity using the I/O device 28. Additionally or alternatively, the computing device 14 may determine the DCF 270 using information stored in the IC design 115, the element definitions 120 and the verification information 125.

In embodiments, the information used to determine complexity for a logic block includes one or more of the following: the total number of latch circuits, the clock frequency of operation, application criticality, the number of bugs, design time constraints (e.g., slack), the number of local clock buffers, the number of connections to other logic blocks and the size the logic block's VHDL file. According to aspects of the invention, the application criticality is a predetermined value assigned to each logic block by a user (e.g., a design engineer). The computing device 14 may receive values for the logic blocks application criticality from a user via, for example, the I/O device 28 and store the values in association with the element definitions 120.

In embodiments, the VCF 275 is a value associated with each of the logic blocks ABC that indicates a relative amount of functionality of each block that is verified. Well-verified designs are less prone for design changes later in design cycle. The VCF 275 may be determined according to Equation (4) below:

$$VCF = 1 - (\text{Normalized percentage of design covered from verification}) \quad (4)$$

The normalized percentage of design covered from verification for each block may be determined using the percentage of design verified 235 of the corresponding one of blocks ABC, normalized based on the percentage of design verified 235 for all the blocks ABC_1 to ABC_5.

The above-described factors 255, including DAF 260, DBF 265, DCF 270 and VCF 275, once determined by the spare latch module 110, may be stored by the spare latch module 110 in association with the corresponding logic block identifiers 210. For instance, the factors 255 may be stored in data files (e.g., VHDL files) associated with the element definitions 120 in storage system 22B. In addition, the factors 255 may be stored as attributes of logic blocks within their corresponding element definitions 120 (e.g., VHDL files).

Still referring to FIG. 2, in accordance with aspects of the invention, the spare latch module 110 determines the Designer Input Factor (DIF) 280 shown in the table 200 based on the above-described inputs 205 and/or the factors 255. The DIF 280 is a value for each of the logic blocks ABC that indicates a proportional allocation of spare latch circuits among the logic blocks ABC. For example, the DIF 280 value for a logic block may be determined according to Equation (5) below:

$$DIF = \frac{(p0*DAF + p1*DBF + p2*DCF + p3*VCF)}{(p0 + p1 + p2 + p3)} \quad (5)$$

As shown in Equation (5), the DIF 280 value may be a weighted average of each of the factors, DAF 260, DBF 265, DCF 270 and VCF 275 modified by the respective weights 290, including p0, p1, p2 and p3. The weights 290 represent a priority-wise contribution for factors DEF 260, DBF 265, DCF 270 and VCF 275 in determining the DIF 280 values for the logic blocks.

In embodiments, the weights 290 are predefined values stored in, for example, the IC design 115. In other embodiments, a user assigns the weights 290 to each of the factor used to determine the DIF 280 values. For example, the spare latch module 110 may execute a script that prompts a user to input values for p0, p1, p2 and p3 via the I/O device 28. In such case, the values of the weights 290 may be based on the user's knowledge and experience.

For instance, a design engineer may consider all the factors equally important. In this case, for each factor 255, the design engineer may assign equal weights 290, such as, p0=0.25, p1=0.25, p2=0.25 and p3=0.25, wherein the total value of p0, p1, p2 and p3 equals one (1.00). Alternatively, the design engineer may consider the DBF 265 and DCF 270 to have the greatest impact on the distribution of spare latch circuits in the design. In this case, the design engineer may assign the DBF 265 and DCF 270 greater weights, such as p0=0.10, p1=0.40, p2=0.40 and p3=0.10, wherein the total value of p0, p1, p2 and p3 equals one (1.00). Of course, the design engineer can exclude one or more of the factors 255 by setting the corresponding weight to zero (0.00) and increasing the weights 290 of the remaining factors such that the total of the weights still equals one (1.00).

According to aspects of the invention, using the example information of the table 200 described above, the spare latch module 110 determines a DIF 280 value for each logic block ranging between 0 to 1, wherein higher DIF 280 value represents a greater probability the design of a a particular logic block will change and, conversely, a lower DIF 280 value represents a lower probability that the design will change. Advantageously, where the DIF 280 values provide a strong indicator that a particular logic block is likely to change, spare latch circuits may be effectively allocated to the particular logic block, and more specifically to local clock buffers (LCBs) corresponding to the particular logic block. In accordance with aspects of the invention, the design application 105 allocates numbers of spare latch circuits to respective logic blocks in the IC design 115 based on the determined DIF 280 values, for example, proportionally based on the respective DIF 280 values for each respective logic block. The total number (i.e., quantity) of spare latches of allocation may be stored in, for example, the IC design 115.

According to aspects of the invention, the number of spare latches in the IC design 115 is limited to a finite value due to design limitations (e.g., size, cost, complexity). Thus, the available number of the spare latch circuits may be limited by a user to, for example, 5%-10% of the total number of functional latches used in the IC design 115. Additionally or alternatively, the design application 105 may determine the available number of spare latch circuits based on, for example, physical, timing and/or power constraints.

In embodiments, using the total number of spare latch circuits and the DIF 280 values determined by the spare latch module 110, the design application 105 allocates the spare latch circuits among logic blocks ABC and, further, places the spare latches in the IC design 115 among the logic blocks ABC according to the allocation. For example, if there are one-thousand (1000) spare latch circuits available in the example of the table 200, the design application 105 would distribute the spare latch circuits as follows:
ABC_1 (DIF=0.4), 400 spare latch circuits, ABC_2 (DIF=0.25), 250 spare latch circuits, ABC_3 (DIF=0.2), 200 spare latch circuits, ABC_4 (DIF=0.1), 100 spare latch circuits, ABC_5 (DIF=0.05), 50 spare latch circuits.

Flow Diagrams

Figure 3:
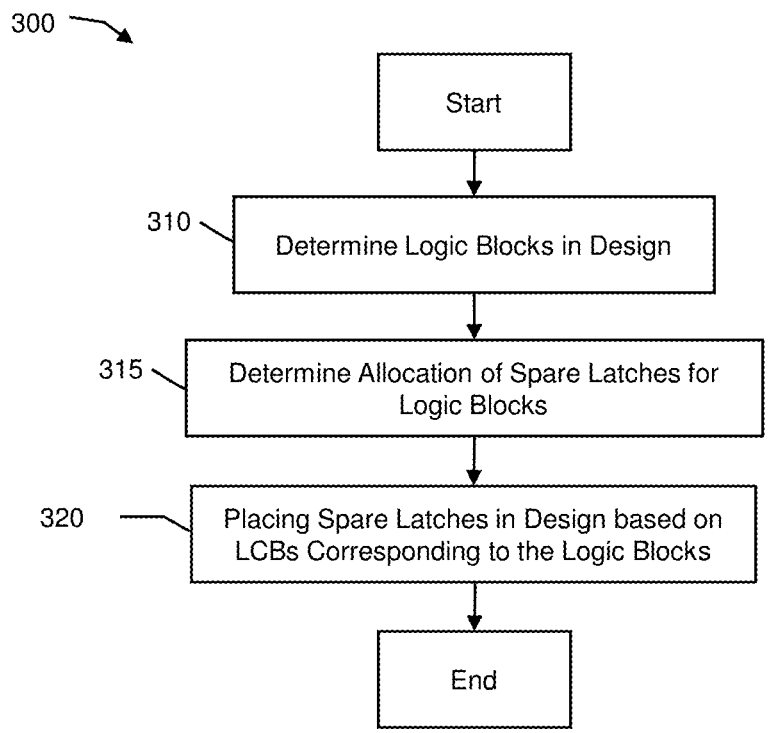
FIG. 3 shows a flow diagram of an exemplary process usable to determine allocations of spare latch circuits for implementing designs and steps in accordance with aspects of the invention.
Figure 4:
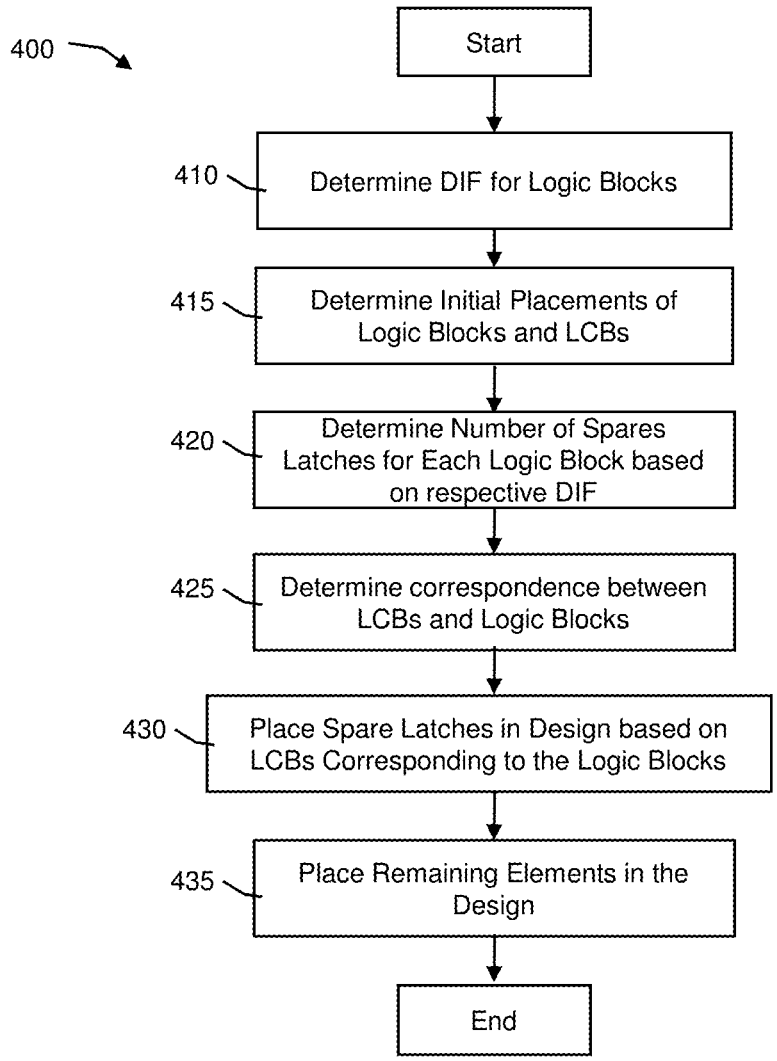
FIG. 4 shows a flow diagram of an exemplary process for determining factors usable to allocate spare latch circuits for implementing designs and steps in accordance with aspects of the invention.

FIGS. 3 and 4 show exemplary flows for performing aspects of the present invention. The steps of FIGS. 3 and 4 may be implemented in the environment of FIG. 1 and using information identified in FIG. 2, for example.

The flowcharts in FIGS. 3 and 4 illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

Furthermore, the invention can take the form of a computer program product accessible from a computer-usable or computer-readable medium providing program code for use by or in connection with a computer or any instruction execution system. The software and/or computer program product can be implemented in the environments of FIG. 1. For the purposes of this description, a computer-usable or computer readable medium can be any apparatus that can contain, store, communicate, propagate, or transport the program for use by or in connection with the instruction execution system, apparatus, or device. The medium can be an electronic, magnetic, optical, electromagnetic, infrared, or semiconductor system (or apparatus or device) or a propagation medium. Examples of a computer-readable storage medium include a semiconductor or solid state memory, magnetic tape, a removable computer diskette, a random access memory (RAM), a read-only memory (ROM), a rigid magnetic disk and an optical disk. Current examples of optical disks include compact disk—read only memory (CD-ROM), compact disc—read/write (CD-R/W) and DVD.

FIG. 3 shows a flow diagram of an exemplary process usable to determine allocations of spare latch circuits. At step 310, the computing device 14 determines (e.g., using design application 105) logic blocks in a design. The logic blocks in the design may be determined, for instance, from information stored in the IC design 115 identifying elements included in the design. The logic blocks may also be determined by the design application 105 using the element definitions 120 to synthesize and/or layout the elements of the design.

At step 315, the computing device 14 determines (e.g., using the spare latch module 110) an allocation of spare latch circuits among the logic blocks based on respective attributes of the logic blocks. The attributes may be obtained from the element definitions 120 (e.g., VHDL attributes) corresponding to each logic block. In addition, the attributes may be obtained from a user (e.g., a design engineer) via an interactive user interface provided by the spare latch module 110. Also, the attributes may be retrieved from the verification information 125 which includes data from verification reports corresponding to the logic blocks including, for example, numbers of bugs that have been found in a logic block design.

As described above with regard to the table 200 in FIG. 2, the determined allocation may, based on the respective attributes of the logic block, correspond to the likelihood that a logic block design will change. The attributes may be taken from values of the inputs 205, including an age 220, a previous usage 225, a number of bugs 230 and/or a percentage of design verified 235. For instance, a logic block having a low age 220, low previous usage 225, a high number of bugs 230 and/or a low percentage of design verified 235, is likely to produce in an engineering change order (ECO) involving a change in the block's design. As additionally shown in the table 200 of FIG. 2, the allocation of spare latches among the logic blocks may be a proportional allocation determined by calculating a weighted average of values corresponding to the attributes of each logic block and normalizing the weighted average across all of the logic blocks.

In some embodiments, the computing device 14 determines the allocation of spare latches by calculating a DIF 280 value for each the logic blocks based on one or more of the blocks' corresponding attributes. As shown in the table 200 above, the DIFs 280 may be normalized values that are determined using one or more factors 255 (e.g., DAF 260, DBF 265, DCF 270 and/or VCF 275) which, in turn, may be determined based on the inputs 205. As also shown in table 200, the factors 255 used to determine the DIF 280 may be weighted to emphasize one or more of the factors over others. According to aspects of the invention, the number of spare latch circuits allocated to a particular logic block is determined by multiplying the value of the DIF 280 for the logic block by the total number of spare latches.

At step 320, the computing device 14 places (e.g., using the design application 105) the spare latch circuits in the IC design 115 in accordance with the determined proportional allocation by identifying (i.e., finding) LCBs corresponding, respectively, with the logic blocks. In some embodiments, the proportional allocation is based on the DIF 280 value determined for each logic block.

The LCBs may be identified based on the IC design 115 and/or the element definitions 120. For instance, when the physical layout of the logic blocks in the IC design 115 is determined (e.g., by the design application 105 and/or a design engineer), LCBs are placed in close spatial proximity to the logic blocks to provide local sources of clock signals. Accordingly, each of the logic blocks described with respect to steps 310, 315 and 320 may have one or more corresponding LCBs according to the IC design 115 and/or the element definitions 120. The design application 105 may reference the IC design 115 and identify corresponding LCBs based on their spatial proximities and/or connections to the logic blocks.

Based on the identified LCBs, the computing device 14 places the spare latch circuits allocated to each logic block (e.g., from step 325) in close spatial proximity to the LCBs. For example, the design application 105 may insert the spare latch circuits into the IC design 115 at locations sufficiently close to an LCB such that the spare latch circuits could be operatively connected to the LCB if needed for a future design change. In embodiments, where a logic block has more than one corresponding LCB, the design application 105 divides the number of spare latch circuits equally between the corresponding LCBs.

FIG. 4 shows a flow diagram of an exemplary process for determining factors usable to allocate spare latch circuits. As shown in FIG. 4, at step 410, the computing device determines (e.g., using the spare latch module 110) a DIF 280 for each of the logic blocks in the IC design 115. As detailed above with reference to FIG. 2, the values of the DIF 280 for each logic block may be based on one or more of an design age factor (DAF) 260, a design bug factor (DBF) 265, as design complexity factor (DCF) 270 and a verification coverage factor (VCF) 275. These factors 255 may be determined based on value of the inputs 205 (e.g., age 220, previous usage 225, number of bugs 230 and/or a percentage of design verified 235). Further, one or more of the factors 255 may be emphasized in the DIF 280 over the others based on weights 290.

At step 415, the computing device 14 determines (e.g., using the design application 105) initial placements of logic blocks and LCBs in the design. The design application 105 may determine the placements of the logic blocks and LCBs using information in the IC design 115 and the element definitions 120, including, for example, physical area constraints, timing constraints, power constraints, design library information, synthesis rules, operating conditions, and other such information used to synthesize and/or layout the elements in an IC.

At step 420, the computing device 14 determines a number a spare latch circuits to allocate to each of a plurality of logic blocks based on values of the DIF 280 corresponding, respectively, to the logic blocks. As discussed above, due to practical considerations, the number of spare latch circuits that can be placed in the design 115 is limited. Accordingly, the total number of spare latches may be predetermined information that the design application 105 retrieves from the IC design 115. Alternatively, the design application 105 may determine the total number of spare latch circuits based on physical, timing and/or power constraints in the IC design 115.

At step 425, the computing device 14 determines the correspondence between LCBs and respective logic blocks in the IC design 115. In embodiments, the computing device 14 determines the correspondence based on a physical layout of elements as defined by the IC design 115. For instance, based on the physical layout, the computing device 14 may determine that an LCB corresponds to a logic block when the LCB is located in close spatial proximity and/or operatively connected to the logic block.

At step 430, the computing device 14 places the spare latch circuits with the logic blocks in the IC design 115 according to the determined allocation. In embodiments, the spare latch circuits are placed among the LCBs corresponding, respectively, to logic blocks. The design application 105 may place the spare latch circuits by inserting the circuits into the IC design 115 at locations sufficiently close to an LCB such that the spare latch circuits may be operatively connected to the LCB in a design change. In embodiments, where a logic block has more than one corresponding LCB, the design application 105 divides the number of spare latch circuits equally between the corresponding LCBs. At step 435, the computing device places (e.g., using deign application 105) the remaining elements in the design.

Figure 5:
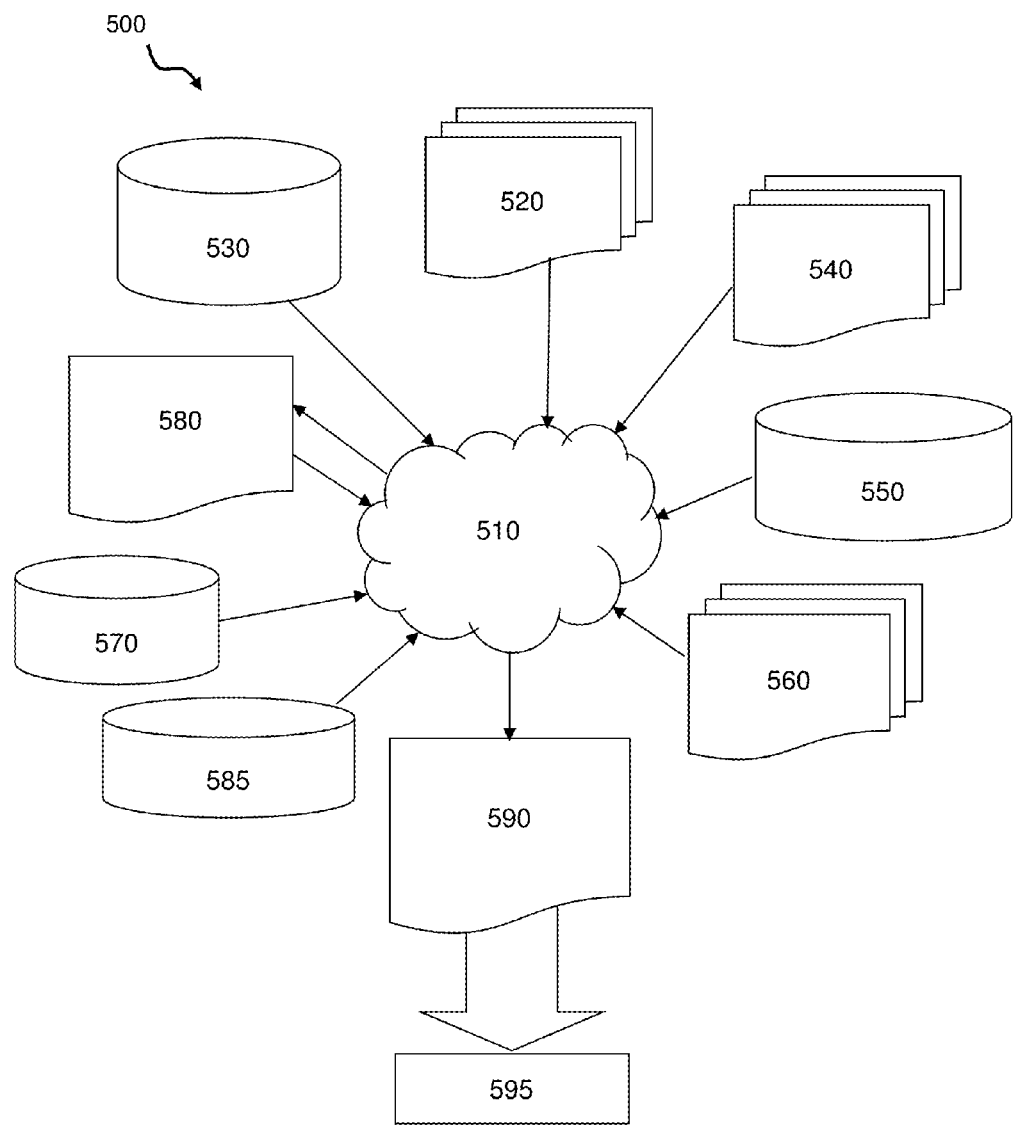
FIG. 5 is a flow diagram of a design process used in IC design, manufacture, and/or test.

FIG. 5 is a flow diagram of a design process used in semiconductor design, manufacture, and/or test. FIG. 5 shows a block diagram of an exemplary design flow 500 used for example, in semiconductor IC logic design, simulation, test, layout, and manufacture. Design flow 500 includes processes, machines and/or mechanisms for processing design structures or devices to generate logically or otherwise functionally equivalent representations of the design structures and/or devices. The design structures processed and/or generated by design flow 500 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 500 may vary depending on the type of representation being designed. For example, a design flow 500 for building an application specific IC (ASIC) may differ from a design flow 500 for designing a standard component or from a design flow 500 for instantiating the design into a programmable array, for example a programmable gate array (PGA) or a field programmable gate array (FPGA) offered by Altera® Inc. or Xilinx® Inc.

FIG. 5 illustrates multiple such design structures including an input design structure 520 that is preferably processed by a design process 510. Design structure 520 may be a logical simulation design structure generated and processed by design process 510 to produce a logically equivalent functional representation of a hardware device. Design structure 520 may also or alternatively comprise data and/or program instructions that when processed by design process 510, generate a functional representation of the physical structure of a hardware device. Whether representing functional and/or structural design features, design structure 520 may be generated using electronic computer-aided design (ECAD) such as implemented by a core developer/designer. When encoded on a machine-readable data transmission, gate array, or storage medium, design structure 520 may be accessed and processed by one or more hardware and/or software modules within design process 510 to simulate or otherwise functionally represent an electronic component, circuit, electronic or logic module, apparatus, device, or system. As such, design structure 520 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 510 preferably employs and incorporates hardware and/or software modules (e.g., the design application 105) for synthesizing, translating, or otherwise processing a design/simulation functional equivalent of the components, circuits, devices, or logic structures to generate a netlist 580 which may contain design structures such as design structure 520. Netlist 580 may comprise, for example, compiled or otherwise processed data structures representing a list of wires, discrete components, logic gates, control circuits, I/O devices, models, etc. that describes the connections to other elements and circuits in an integrated circuit design. Netlist 580 may be synthesized using an iterative process in which netlist 580 is resynthesized one or more times depending on design specifications and parameters for the device. As with other design structure types described herein, netlist 580 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 510 may include hardware and software modules for processing a variety of input data structure types including netlist 580. Such data structure types may reside, for example, within library elements 530 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 540, characterization data 550, verification data 560, design rules 570, and test data files 585 which may include input test patterns, output test results, and other testing information. Design process 510 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 510 without deviating from the scope and spirit of the invention. Design process 510 may also include modules for performing standard circuit design processes such as timing analysis, verification, design rule checking, place and route operations, etc.

Design process 510 employs and incorporates logic and physical design tools such as HDL compilers and simulation model build tools to process design structure 520 together with some or all of the depicted supporting data structures along with any additional mechanical design or data (if applicable), to generate a second design structure 590.

Design structure 590 resides on a storage medium or programmable gate array in a data format used for the exchange of data of mechanical devices and structures (e.g. information stored in an IGES, DXF, Parasolid XT, JT, DRG, or any other suitable format for storing or rendering such mechanical design structures). Similar to design structure 520, design structure 590 preferably comprises one or more files, data structures, or other computer-encoded data or instructions that reside on transmission or data storage media and that when processed by an ECAD system generate a logically or otherwise functionally equivalent form of one or more of the embodiments of the invention. In one embodiment, design structure 590 may comprise a compiled, executable HDL simulation model that functionally simulates the devices.

Design structure 590 may also employ a data format used for the exchange of layout data of integrated circuits and/or symbolic data format (e.g. information stored in a GDSII (GDS2), GL1, OASIS, map files, or any other suitable format for storing such design data structures). Design structure 590 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure. Design structure 590 may then proceed to a stage 595 where, for example, design structure 590: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein. Many modifications and variations will be apparent to those of ordinary skill in the art without departing from the scope and spirit of the invention. The corresponding structures, materials, acts, and equivalents of all means or step plus function elements in the claims, if applicable, are intended to include any structure, material, or act for performing the function in combination with other claimed elements as specifically claimed. Accordingly, while the invention has been described in terms of embodiments, those of skill in the art will recognize that the invention can be practiced with modifications and in the spirit and scope of the appended claims.

What is claimed:

1. A method implemented by a computer, comprising:
   determining, using the computer, placements of logic blocks and local clock buffers in an integrated circuit (IC) design;
   determining, using the computer, an allocation of spare latch circuits to the logic blocks in the IC design based on corresponding design input factors;
   determining, using the computer, a correspondence between the local clock buffers and logic blocks in the IC design; and
   based on the determined correspondence between the local clock buffers and the logic blocks, placing, the number of the spare latch circuits in the IC design in accordance with the determined allocation of the spare latch circuits, wherein the placing distributes the number of the spare latch circuits among the local clock buffers.

2. The method of claim 1, wherein the distributing the number of spare latch circuits among the local clock buffers includes dividing the spare latch circuits equally among respective local clock buffers of the logic blocks.

3. The method of claim 1, wherein the design input factors are based on spare latch design factors, including at least one: a design age factor, a design bug factor, a design complexity factor, and a verification coverage factor.

4. The method of claim 3, further comprising obtaining one or more of the spare latch design factors from a hardware definition language (HDL) information corresponding to the logic blocks.

5. The method of claim 3, further comprising receiving one or more of the spare latch design factors from a user via an interactive user interface.

6. The method of claim 3, further comprising retrieving one or more of the spare latch design factors from a logic block verification database.

7. The method of claim 1, wherein the determining the allocation of spare latch circuits comprises, for each of the logic blocks, determining a likelihood a logic block design will change based on the spare latch design factors of the logic block.

8. The method of claim 7, wherein the determining the likelihood the logic block design will change comprises:
   determining a weighted average of the spare latch design factors for each of the logic blocks; and
   normalizing each of the weighted averages across the plurality of the logic blocks.

9. The method of claim 1, wherein the spare latch circuits include a latch, a buffer and a clocking structure.

10. A computer program product comprising a computer usable storage device having a computer readable program stored in the computer usable storage device, wherein the computer readable program, when executed on a computing device, is operable to cause the computing device to:
    determine logic blocks in an integrated circuit (IC) design, the logic blocks having respective attributes;
    determine respective spare latch design factors of the logic blocks based on a combination of the respective attributes of the logic blocks;
    determine, based on the respective spare latch design factors of the logic blocks, a relative probability of design change for each of the logic blocks; and
    determine, based on the relative probability of design change for each of the logic blocks, a number of spare latch circuits to allocate among the logic blocks, wherein a logic block having a greater probability of design change is allocated a greater proportion of a total number of available spare latch circuits relative to a logic block having a lower probability of design change.

11. The computer program product of claim 10, wherein:
    the number of spare latch circuits include at least one of a latch, a buffer and a clocking structure; and
    the spare latch design factors include at least one of a design age factor, a design bug factor, a design complexity factor, and a verification coverage factor.

12. A computer program product comprising a computer usable storage device having a computer readable program stored in the computer usable storage device, wherein the computer readable program, when executed on a computing device, is operable to cause the computing device to:
- determine logic blocks in an integrated circuit (IC) design;
- determine, based on respective spare latch design factors of the logic blocks, a relative probability of design change for each of the logic blocks; and
- determine, based on the relative probability of design change for each of the logic blocks, a number of spare latch circuits to allocate among the logic blocks, wherein a logic block having a greater probability of design change is allocated a greater proportion of a total number of available spare latch circuits relative to a logic block having a lower probability of design change,
- wherein the computer readable program is operable to determine the relative probability of design change by:
  - determining a weighted average of the attributes for each of the logic blocks; and
  - normalizing each of the weighted averages across the logic blocks.

* * * * *